United States Patent [19]

Carpenter et al.

[11] 4,290,079

[45] Sep. 15, 1981

[54] SOLDER INTERCONNECTION BETWEEN A SEMICONDUCTOR DEVICE AND A SUPPORTING SUBSTRATE

[75] Inventors: Charles Carpenter, Poughkeepsie; Joseph F. Fugardi, Wappingers Falls; Lawrence V. Gregor, Hopewell Junction; Peter S. Grosewald, Putnam Valley; Morton D. Reeber, Shrub Oak, all of N.Y.

[73] Assignee: International Business Machines Corporation, Armonk, N.Y.

[21] Appl. No.: 53,463

[22] Filed: Jun. 29, 1979

[51] Int. Cl.³ .................. H01L 23/48; H01L 29/46; H01L 29/54
[52] U.S. Cl. ........................... 357/71; 357/68; 357/67; 357/65
[58] Field of Search ............... 357/67, 68, 71, 65

[56] References Cited

U.S. PATENT DOCUMENTS

| | | | |
|---|---|---|---|
| 3,241,931 | 3/1966 | Triggs et al. | 357/67 |
| 3,551,997 | 1/1971 | Etter | 357/71 |
| 3,706,015 | 12/1972 | Schimmer | 357/71 |
| 3,839,727 | 10/1974 | Herdzik et al. | 357/71 |
| 3,881,884 | 5/1975 | Cook et al. | 357/71 |
| 4,054,484 | 10/1977 | Lesh | 357/71 |
| 4,113,578 | 9/1978 | DelMonte | 357/71 |

*Primary Examiner*—Andrew J. James
*Attorney, Agent, or Firm*—Wolmar J. Stoffel

[57] ABSTRACT

A ball limiting metallurgy pad structure for a semiconductor device solder bond interconnection comprising:
  a conductive layer that is adherent to the semiconductor device passivating layer,
  a relatively thick layer of a material having a high thermal conductivity,
  a barrier layer that protects the high conductivity layer by physically preventing any interaction or alloying with the subsequent layers, and
  a layer of a material that is solder wettable.

3 Claims, 2 Drawing Figures

IMPROVED SOLDER INTERCONNECTION BETWEEN A SEMICONDUCTOR DEVICE AND A SUPPORTING SUBSTRATE

DESCRIPTION

Technical Field

This invention relates to electrically joining semiconductor devices to a supporting substrate, more particularly to methods of making improved electrical solder connections and the resultant improved connection structures.

The object of the present invention is to provide a new method of forming solder interconnection structures between a semiconductor device and a supporting substrate.

Another object of this invention is to provide a new solder interconnection structure between a semiconductor device and a supporting substrate particularly suited to high stress use conditions that generate thermal gradients in the interconnection.

Yet another object of this invention is to provide a method for forming a solder interconnection structure.

BACKGROUND ART

There is a need in the semiconductor technology for a solder interconnection structure that will resist thermal migration and also exhibit the ductility to accommodate stresses due to coefficient of expansion differences between the material of the semiconductor device and the substrate.

Integrated circuit devices whether individual active devices, individual passive devices, multiple active devices within a single chip, or multiple passive and active devices within a single chip, require suitable input/output connections between themselves and other circuit elements or structures. These devices are typically very small and fragile. Because of their size and fragility, they are commonly carried on substrates for support. Interconnection of these devices to the substrate is a particular problem. A number of interconnection requirements must be fulfilled before the resultant connection is acceptable.

Thermal bonding processes which are widely employed to make electrical contact to semiconductor devices fail to meet one or more of the following criteria: One criteria is that the interconnection must have sufficient strength to withstand normal shock and vibration associated with information handling systems. Another criteria is that the connecting material must not deteriorate or change electrical or mechanical characteristics when tested under extreme humidity or temperature conditions. Additionally the interconnection must not short circuit the semiconductor. The interconnection must also have a melting point sufficiently high that it will not be affected during any soldering of the substrate to a supporting card. Finally, the connecting material should not produce a doping action on the active and passive chip devices with which the substrate is associated.

The use of a ductile solder pad to support chip devices has been proposed to reduce the transmission of thermal and mechanical stresses to the joint between the pad and the chip device. Such solder pad connections are disclosed and claimed in U.S. Pat. No. 3,495,133. Solder connections are also described in detail in an article entitled "SLT Device Metallurgy and its Monolithic Extension" by P. Totta and R. Sopher in the IBM Journal of Research and Development, Vol. 13 No. 3, May 1969 P. 226 to 238.

These solder connections have proven very successful for electrically joining highly integrated semiconductor devices with numerous input/output pads to suitable supporting substrates. This invention is an improved solder connection adapted for use in highly integrated semiconductor devices operating at high power levels where significant amounts of heat are generated by and within the device. The solder connection is adapted to operate for long periods of time under highly stressed conditions.

BRIEF DESCRIPTION OF DRAWINGS

In the accompanying drawings forming a material part of this disclosure.

DISCLOSURE OF INVENTION

Figure 1:
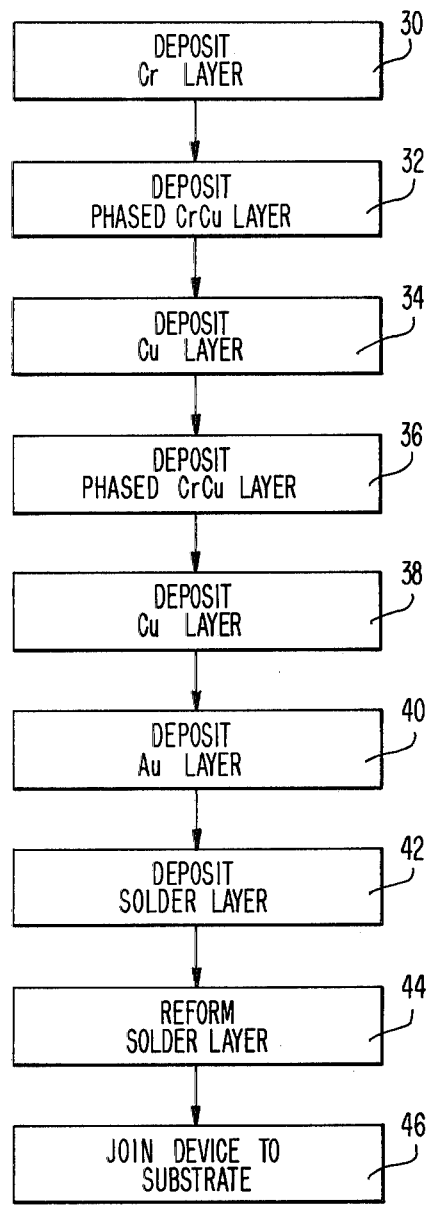
FIG. 1 is a flow diagram illustrating the various steps of the process of the invention.

For further comprehension of the invention, and of the objects and advantages thereof, reference will be had to the following description and accompanying drawings, and to the appended claim in which the various novel features of the invention are more particularly set forth.

In solder bonded highly integrated semiconductor devices, a large portion of the heat energy generated during operation of the device is dissipated to the supporting substrate through the solder bonds. This situation exists even when the devices are immersed in a cooling liquid, as in the structure depicted in U.S. Pat. No. 3,741,292, or when the heat is removed from the back side of the device through conduction structures, as illustrated in the cooling structure depicted in U.S. Pat. No. 3,993,123. The flow of heat energy through the bond establishes thermal gradients in the solder bond interconnections which lead to thermal migration of the atoms of solder in the interconnection. The material flow (J), can be characterized by the expression $J \sim D \Delta E \, \Delta T/T^2$ where D is the diffusion coefficient, E is the energy term associated with the heat of transport and enthalpy of formation of a vacancy, and T is the temperature in degrees Kelvin. The direction of solder atom flow in a solder connection, subjected to a thermal gradient is from the semiconductor device, i.e., the heat source, towards the cooler substrate, with vacancies diffusing towards the semiconductor. The radial component of the thermal gradient, caused by the constriction of the solder joint as it passes through the via in the glass layer concentrates the vacancies into the center of the via at the ball-limiting metallurgy. This leads to an interruption in the joint continuity and a gradual increase in the joint electrical resistance with time, particularly under high stress use conditions.

It has been discovered that the various types of solders that are used in solder joint interconnections have differing rates for the formation of vacancies in the solder joint. The choice of solder may, however, be limited for practical considerations. Semiconductor devices are normally made of silicon which has a coefficient of expansion of $3 \times 10^{-6} M/M \, °K$. The supporting substrates are normally formed of ceramic materials which have coefficients of expansion in the range of 4.8 to $6.8 \times 10^{-6} M/M \, °K$. This difference in expansion coefficient results in stressing of the solder bonds during fabrication and also during operation as the device temperature fluctuates. Desirably the solder used in the interconnection will have sufficient ductility to relieve, at least in part, the stresses resulting from temperature fluctuations. A desirable solder for this purpose is one that embodies a large percentage of indium. However, unfortunately, indium solders exhibit very significant thermal migration during use.

The general objective of the improved solder bond connection of the invention is to provide and preserve a relatively thick layer of copper in the ball limiting metallurgy pad. Since copper is an excellent heat conductor, the radial thermal gradient within the via is reduced. Consequently, the driving force for thermal migration that concentrates vacancies at the center of the BLM is reduced, and the connection does not significantly deteriorate in use.

Figure 2:
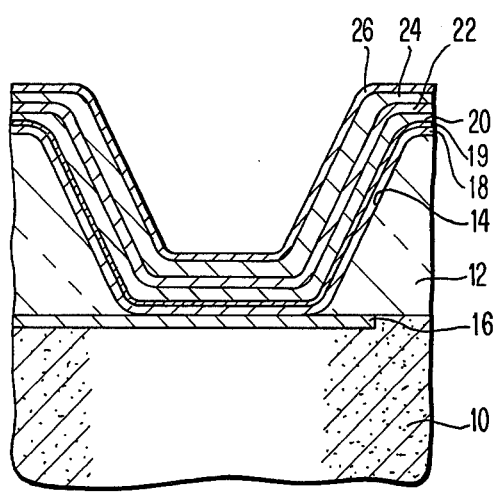
FIG. 2 is a section elevational view illustrating a cross section of the solder pad of the invention.

Referring now to FIG. 2 there is depicted a preferred specific embodiment of the ball limiting pad metallurgy of the invention. The substrate 10 has an overlying insulating $SiO_2$ layer 12 provided with a via 14 which extends through layer 12 to make an electrical connection to a diffused region 16. The device normally will have several metallurgy layers embodying a metallurgy system that interconnects the various active and passive elements into the desirable circuitry. The drawing depicts a simple structure for purposes of illustration. In the method a layer 18 of chromium is deposited on the surface of the layer 12 typically by vacuum evaporation technology. This step is indicated by block 30 in FIG. 1. A phased copper-chromium layer 19 is deposited on layer 18 as below. This step is indicated in FIG. 1 by block 32. Subsequently a layer 20 of copper is deposited over layer 19, by vacuum evaporation techniques. This step is indicated in FIG. 1 by block 34. A phased copper-chromium layer 22 is deposited on layer 20 as indicated by block 36. This phased layer consists of a combination of copper and chromium. When utilizing evaporation techniques to deposit the various metals, the heater to the copper source is left on while the heater to the chromium is turned on. Subsequently the heater to the chromium is turned off. Thus both chromium and copper are simultaneously deposited for an interval of time, followed by the deposition of a pure copper layer. This step is indicated in FIG. 1 by block 38. Finally, a thin gold layer is evaporated to protect the metallurgy. This step is indicated in FIG. 1 by block 40. Conventionally the layers 18 through 26 are deposited as blanket layers. Following the last layer, a layer of resist is formed on the surface, exposed to the desired pattern and developed. The periphery of the ball limiting metallurgy pad extends beyond the diameter of via 14. Suitable etching solutions are used to remove the exposed areas of layers 18 through 26 to define the ball limiting metallurgy pad.

A relatively thick layer of solder is deposited on the ball limiting metallurgy pad preferably by evaporating through a metal mask with apertures which overlie and extend beyond the area of the pad. This step is indicated as block 42 on FIG. 1. The deposited solder layer is then re-formed by heating to allow surface tension to move the solder from the non-wettable $SiO_2$ surface areas as is well known in the art. Since the top surface layer of the ball limiting metallurgy is solder wettable, and the top surface of layer 12 is not, the solder will ball over the pad when heated. This step is indicated as block 44 in FIG. 1. The device is subsequently positioned over the substrate which contains a set of solder wettable pads corresponding to the configuration of the pads on the device and the assembled unit heated. The solder on the terminal will melt thus electrically joining the pads on the device and substrate. This operation is indicated by block 46 in FIG. 1. During the re-forming step 44 and the joining step 46, the solder will combine with the gold layer 26 and also the copper layer 24 forming an intermetallic compound which remains in the solder. However, the phased chromium copper layer 22 does not dissolve in the molten solder during the aforementioned operations but remains solder wettable. This layer 22 serves as a barrier between the molten solder and the copper layer 20 in the ball limiting metallurgy. Thus the integrity of layer 20 is maintained by the chromium-copper phased layer 22. Copper layer 20, during operation of the device serves as an excellent heat conducting layer thereby minimizing the thermal gradients within the solder terminal and also the thermal migration of material which would otherwise increase the resistance of the solder joint and ultimately cause an open. It has been determined that lead-indium solder, preferably 50% lead 50% indium is sufficiently ductile to relieve stresses due to differential coefficients of expansion of the device and substrates during thermal cycling. However, this solder is more susceptible to thermal migration due to thermal gradients in the solder joint.

In the ball limiting metallurgy pad the thickness of layer 18 is in the range of 500 to 1500 Å. Layers 19 and 22, which are phased chromium-copper layers can have any suitable thickness, most preferably in the range of 500 to 1500 Å. Copper layer 24 has a thickness in the range of 2000 to 5000 Å, while copper layer 20 has a thickness in the range of 5000 to 10,000 Å.

It is understood that phased copper-chromium layers can be formed at some or all layer interfaces if desired.

The following examples are presented to illustrate the practice of the method of the invention and also to compare the resulting terminal with conventional device terminals known in the art.

EXAMPLE I

Dummy semiconductor chips were prepared for testing solder bonds under accelerated testing. A silicone wafer of a first conductivity type was prepared by making a plurality of diffused regions therein of an opposite conductivity. A passivating layer of $SiO_2$ was deposited on the surface and via holes etched therethrough having an average diameter of 3 mil. In each test device four vias were made to each diffused region. The region was used as a resistor where power was applied to the end terminals to heat the device. Solder bond terminals made to the intermediate vias for accelerated testing to determine resistance change. For use as a comparison conventional ball limiting metallurgy pads were made and tested. The ball limiting metallurgy pads of the prior art were made by evaporating a chromium layer having a 5 mil diameter and a thickness of 1500 Angstroms concentric with the vias etched in the passivating layer. A phased chromium-copper layer having a 1000 Angstrom thickness was deposited over the chromium layer and an evaporated copper layer having a thickness of 5000 Angstroms evaporated on the chromium-copper layer. A gold flash was deposited having an approximate thickness of 1200 Angstroms. A layer of 50% lead 50% indium solder was deposited over the ball limiting metallurgy pad having a thickness of approximately 5 mils and the layer reflowed to form solder pads. The wafer was sectioned separating each of the diffused regions for use as a test vehicle. Several of the solder balls were pulled off the chip. When solder balls are pulled from the pad in this manner, the ductility of the solder permits it to elongate before it ruptures. In each instance a ragged surface over the entire area of the pad was observed which indicated that the adhesion was relatively uniform across the entire via and surrounding pad. The initial electrical resistances of the terminals were measured and found to be in the range of 8 to 9 milliohms. The highest resistance joints were chosen for continuous monitoring. The devices were then powered at approximately 12 watts per chip which is an abnormally high power level used for accelerated testing. At the end of fourteen hours the average terminal resistance of the monitored joints increased by 10 milliohms. This was used as a standard of comparison. The solder balls were pulled apart. It was observed that the center portion of the solder terminal separated cleanly whereas the edge material around the via displayed a ragged surface. This indicated that there was a separation of material at the center of the joint in the via hole which was not present in the pads prior to their testing.

EXAMPLE II

A second set of dummy device chips described in Example I were prepared which embodied the solder terminal pad of the invention. The solder pads were formed over vias which also had a 3 mil diameter by depositing a 500 Angstrom layer of chromium, a chromium-copper phased layer of 1000 Angstroms, a copper layer of 10,000 Angstroms, a second chromium-copper phase layer having a thickness of 1,000 Angstroms, a copper layer of a thickness of 5000 Angstroms and a gold layer with 1200 Angstroms thickness. A solder layer formed of 50% lead and 50% indium was deposited over the ball limiting metallurgy lands which layer had a thickness of 5 mils. The solder was reflowed as in Example I and several solder balls pulled apart from the solder pad. Again as in Example I the entire surface of the pad was jagged indicating adhesion across the entire via. The test chips were then joined to a substrate and powered with approximately 12 watts per chip as in Example I. The resistance of the solder terminals produced by the method of the invention was initially tested and also found to have an average resistance of 8 to 9 milliohms. After powering the test chip for three hours the resistance of the terminals were measured and no measurable change in resistance noted. The powering of the test chips continued and the resistance was periodically measured. At the end of 63 hours the worst case solder bond indicated a resistance increase of 10 milliohms. The average resistance increase at this point was 2.3 milliohms. A plot of resistance increase versus time was made and with this procedure a projected time was determined for the average solder terminal to reach a resistance increase of 10 milliohms. This projected time was 279 hours. Several solder terminals were pulled from the test device on termination of the power testing and the surfaces noted. At the end of 63 hours of testing, no noticeable smoothness of the separated surface was noted at the via center area. Accelerated testing continued. At the end of 93 hours the average resistance increase of the solder bond was found to be 3.3 milliohms. Comparison of the results of Example I wherein a conventional solder bond with a chromium-copper gold ball limiting metallurgy layer pad was tested, and Example II wherein the pad of the subject method was tested, indicated that solder joints of the invention are superior to those of the prior art.

What is claimed is:

1. An improved ball limiting metallurgy pad structure for a solder interconnection for a semiconductor device comprising,
    a first layer of chromium,
    a phased layer of chromium-copper,
    a first layer of copper,
    a phased layer of chromium-copper,
    a second layer of copper,
    a surface layer of gold.

2. The ball limiting metallurgy pad structure of claim 1 wherein said first layer of copper has a thickness in the range of 5000 to 10,000 angstroms.

3. The ball limiting metallurgy pad structure for a semiconductor device solder bond interconnection that is made from electrically conductive materials consisting of:
    an adherent layer formed of chromium that will bond to the passivating layer of a semiconductor device
    a relatively thick layer of high thermal conductivity metal bonded to said chromium layer
    a barrier layer formed of a metal that protects said high conductivity metal layer by physically preventing any interaction or alloying with overlying layers
    a layer that is formed of a solder wettable metal
    a surface protective layer
    said layer of high thermal conductivity metal, when said pad structure is joined to a substrate with a solder connection, capable of reducing the radial thermal gradient within said interconnection,
    said barrier layer preventing dissolution and interaction of said layer of high thermal conductivity metal with the molten solder during the joining operation.

* * * * *